United States Patent [19]
Hikichi et al.

[11] Patent Number: 5,914,905
[45] Date of Patent: Jun. 22, 1999

[54] SEMICONDUCTOR INTEGRATED CIRCUIT

[75] Inventors: Hiroshi Hikichi; Yasushi Fukuhara, both of Kanagawa, Japan

[73] Assignee: NEC Corporation, Tokyo, Japan

[21] Appl. No.: 08/964,360

[22] Filed: Nov. 4, 1997

[30] Foreign Application Priority Data

Nov. 8, 1996 [JP] Japan ................................ 8-296325

[51] Int. Cl.⁶ ............................................. G11C 7/00
[52] U.S. Cl. ................................. 365/229; 365/230.06
[58] Field of Search .............................. 365/229, 230.06, 365/227

[56] References Cited

U.S. PATENT DOCUMENTS

| | | | |
|---|---|---|---|
| 4,970,694 | 11/1990 | Tanaka et al. | 365/230.06 X |
| 5,208,781 | 5/1993 | Matsushima | 365/227 X |
| 5,301,144 | 4/1994 | Kohno | 365/230.06 X |
| 5,712,823 | 1/1998 | Gillingham | 365/230.06 X |

FOREIGN PATENT DOCUMENTS 6-35743  2/1994  Japan .

*Primary Examiner*—Huan Hoang
*Attorney, Agent, or Firm*—Young & Thompson

[57] ABSTRACT

A semiconductor integrated circuit having a decoder for decoding a first signal supplied thereto and having a plurality of bits and outputting a second signal in which only a predetermined bit of the plurality of bits of the first signal is set at active level, and an internal circuit for, in an ordinary operation mode in which a standby signal is at first level, performing a predetermined processing operation in response to the second signal decoded by said decoder and, in a standby mode in which the standby signal is at second level, stopping the predetermined processing operation to be set in a low power consumption state, comprising a signal level fixing circuit for, when the standby signal is at second level, fixing the predetermined bit of the plurality of bits of the first signal at predetermined level, and supplying a resultant signal to said decoder.

8 Claims, 10 Drawing Sheets

SEMICONDUCTOR INTEGRATED CIRCUIT

BACKGROUND OF THE INVENTION

1. Field of the Invention

The present invention relates to a semiconductor integrated circuit and, more particularly, to a large-scale semiconductor integrated circuit, e.g., a microcomputer, having a standby function of stopping the entire operation to set a low power consumption state and incorporating decoders for a ROM, a RAM, a selector, and the like.

2. Description of the Prior Art

In recent years, as the micropatterning technique in the semiconductor integrated circuit manufacturing technology progresses, the thickness of the gate oxide film becomes extremely thin, and the leakage current defect caused by breakdown of the gate oxide film fabricated during manufacture poses a problem. This problem is particularly conspicuous in a state wherein the entire operation of a semiconductor integrated circuit, e.g., a microcomputer is stopped by a signal input from an external terminal or a program that aims at reducing the power consumption (this state will be referred to as the standby mode hereinafter). The larger the circuit scale, the more likely that a defect occurs.

The general arrangement of a microcomputer having the standby mode will be described with reference to the block diagram shown in FIG. 1.

In the normal operation, this microcomputer supplies a system clock SCK generated by an oscillator 12 to a CPU 11 and peripheral units 13a to 13d including a serial interface, a ROM, a RAM, a timer, and the like, so that the entire microcomputer operates. When a request for transition to the standby mode occurs, a standby signal STBY serving as a control signal which sets the standby mode is generated in the CPU 11 and is input to the oscillator 12. Upon reception of the standby signal STBY, the oscillator 12 stops oscillation, and stops supplying the system clock SCK to the CPU 11 and peripheral units 13a to 13d, thereby stopping the entire operation of the microcomputer.

The factor that causes the leakage current to pose a problem particularly in the standby mode will be explained. FIG. 2 is a sectional view of an inverter circuit portion included in a CMOS-type semiconductor integrated circuit, e.g., a microcomputer. A gate Gn, a source Sn, and a drain Dn constitute an n-channel type transistor (to be referred to as an n-channel transistor hereinafter), and a gate Gp, a source Sp, and a drain Dp constitute a p-channel type transistor (to be referred to as a p-channel transistor hereinafter).

In the manufacturing process, when gate oxide films GOn and GOp of the n- and p-channel transistors are broken, the electrical insulating properties decrease, and a leakage current flows between the gate Gn of the n-channel transistor and a group of the source Sn, drain Dn, p-well 102 and a p-type substrate 101, and between the gate Gp of the p-channel transistor and a group of the source Sp, drain Dp, an n-well 103 and the p-type substrate 101. In order to prevent supply of defective products having such a leakage current defect in the standby mode to the market, usually, data "0" and "1" are written in all the memory elements, e.g., a RAM cell, a register, and the like. The current obtained with each of data "0" and "1" in the standby mode is measured twice. Thereafter, only the non-defective products are shipped to the market.

An output from which one of decoders for a ROM, a RAM, a selector, and the like goes active in the standby mode is indefinite. In order to prevent supply of defective products having a leakage current defect to the market, outputs from the respective decoders must be set at low level one by one, and the resultant current must be measured. For this reason, the larger the decoder scale becomes, the longer the time required for measuring the leakage current. This will be explained using a 64-kbyte mask ROM (the first example of a conventional semiconductor integrated circuit) with reference to FIG. 3 showing the arrangement of this mask ROM.

A row decoder 2x decodes address data A6 to A15 and outputs them onto word lines WL1 to WLm of a memory cell array 1x. Namely, one of the 1,024 word lines WL1 to WLm (m=1,024) of the 64-kbyte memory cell array 1x is selected by the 10 upper bits of 16-bit address data A0 to A15, and is set at active level (selection level).

A column decoder 14 decodes the address data A2 to A5 of the 16-bit address data A0 to A15, and outputs 16 column selection signals YS1 to YSk (k=16) to a column selector 15. 512 bit lines BL11 to BL1k, . . . and BLn1 to BLnk (n=32) have been input to the column selector 15 from the memory cell array 1x. One bit line is selected from each of 32 groups obtained by dividing the 512 bit lines into groups each including 16 bit lines (16×32=512) in accordance with which one of the column selection signals YS1 to YSk input from the column decoder 14 is at "1", and data corresponding to the selected bit lines are output to a sense amplifier 16. For example, when the column selection signal YS1 is at "1", the bit lines BL11 to BLn1 respectively selected from the respective groups each including the 16 bit lines are selected, and data are output to the sense amplifier 16. Namely, the 4 lower bits, excluding the 2 lowest bits A0 and A1 (the 2 lowest bits A0 and A1 are required only when a data read operation is performed in units of bytes, and are not used in this example since the data read operation is performed in units of 32 bits), of the 16-bit address data A0 to A15 select 32 bit lines among the 512 bit lines BL11 to BL1k, . . . and BLn1 to BLnk of the memory cell array 1x.

The sense amplifier 16 detects and amplifies the data of the address on the memory cell array 1x which is designated by the 14-bit address data A2 to A15 in this manner, converts it to a logical value "0" or "1", and outputs it in the form of 32-bit output data DO1 to DOn.

In the mask ROM having this arrangement, when the contents of the address data A2 to A15 change depending on the timing of transition to the standby mode, the contents of one of 1,024 word lines WL1 to WLm selected by the row decoder 2x and 32 of the 512 bit lines BL11 to BL1k, . . . and BLn1 to BLnk selected by the 16 column selection signals YS1 to YSk of the column decoder 14 change. In order to completely detect a leakage current defect in the memory cell array 1x in the standby mode, all possible cases of the address data A2 to A15 which set the standby mode must be assumed. In other words, the leakage current must be measured by setting all of the 1,024 word lines WL1 to WLn and the column selection signals YS1 to YSk at active level in the standby mode. The word lines WL1 to WLm can be set at active level only one at a time. For the measurement of the leakage current, the address data A2 to A15, with which a predetermined one of the 16 column selection signals YS1 to YSk is selected each time the word lines WL1 to WLm are selected one by one, must be set 1,024 times. If one current measurement operation takes 1 msec, a total time equal to or longer than 1 sec is needed. In this manner, the larger the scale and number of decoders for circuits, e.g., a ROM, a RAM, a selector, and the like, the longer the time required for measurement of the leakage current in the standby mode is.

Japanese Unexamined Patent Publication No. 6-35743 discloses an example wherein the leakage current is detected by setting all the word lines at active level and all the bit lines at inactive level by a control signal. FIG. 4 is a circuit diagram of a dynamic ROM (the second example of the conventional semiconductor integrated circuit) fabricated by referring to Japanese Unexamined Patent Publication No. 6-35743.

In this dynamic ROM, in the normal operation, a control signal CNT is at low level, and all word lines WL1 to WLM and all bit lines BL1 to BLN are precharged or discharged with a word line precharge/discharge signal WP·D and a bit line precharge/discharge signal BP·D, respectively, to access an address of a memory cell array 1y which is designated by address data A0 to Aj.

When measuring the leakage current, the control signal CNT is set at high level, and all the word lines WL1 to WLM are set at high level, which is precharge level, by a control circuit 10 and precharge transistors Q21 included in a decoder 2y and all the bit lines BL1 to BLN are set at low level, which is discharge level, by the control circuit 10 and discharge transistors Q12. Then, unlike in the first example, the word lines need not be sequentially set at high level one by one, and the leakage current can be detected with a smaller number of operation times. Of the word and bit lines, one is set at high level while the other is set at low level so that the leakage current of the gate oxide film can be detected more reliably.

FIG. 5 shows a typical example (the third example of the conventional semiconductor integrated circuit) in which the technique of measuring the leakage current by setting all the word lines at high level is applied to a static ROM (an example for explaining the basic principle in which four word lines are provided).

This semiconductor integrated circuit has a row decoder 2, a memory cell array 1, and a decoder output control circuit 9. The row decoder 2 has inverters IV21 and IV22, and AND gates G21 to G24, and outputs a signal that sets one of word lines WL1 to WL4 at high level, which is selection level (active level), in accordance with address data A1 and A2. The memory cell array 1 outputs data, which is stored in a memory cell connected to the word line at selection level, to bit lines BL1 to BLm. The decoder output control circuit 9 has OR gates G91 to G94, transmits an output signal from the row decoder 2 to a corresponding word line when a control signal CNT is at low level, sets all the word lines WL1 to W14 at high level when the control signal CNT is at high level.

In this semiconductor integrated circuit as well, since the control signal CNT is set at high level, the leakage current can be detected with a smaller number of operation times without setting the word lines WL1 to WL4 at high level one by one.

FIG. 6 is a circuit diagram showing an example of another semiconductor integrated circuit (the fourth example) having decoders.

This semiconductor integrated circuit has a frequency divider 4, a decoder 5, and a selector 6. The frequency divider 4 frequency-divides a system clock SCK into three D clock signals DCK1 to DCK3 having different periods. The decoder 5 has inverters IV51 and IV52 and NOR gates G51 to G53, and decodes clock selection control signals SC1 and SC2 and outputs clock selection signals SL1 to SL3. The selector 6 has AND gates G61 to G63 and a NOR gate G64, and selects one of the clock signals DCK1 to DCK3 frequency-divided in accordance with the clock selection signals SL1 to SL3 and supplies the selected signal to an internal processing unit 7 as an internal clock ICK.

In this semiconductor integrated circuit, when the clock selection control signals SC1 and SC2 are (0, 0), the internal clock ICK is not supplied. When the clock selection control signals SC1 and SC2 are (0, 1), (1, 0), and (1, 1), the clock signals DCK1, DCK2, and DCK3 are selected, respectively, and the selected signal is supplied as the internal clock ICK.

In this semiconductor integrated circuit as well, the contents of the clock selection control signals SC1 and SC2 change depending on the timing of transition to the standby mode. Accordingly, in detection of the leakage current in the standby mode, current measurement is performed in all states of the clock selection control signals SC1 and SC2.

In the conventional semiconductor integrated circuits described above, in the first and fourth examples, the contents of signals (A6 to A15, SC1, SC2) input to the row decoder 2x, the decoder 5, and the like change depending on the timing of transition to the standby mode. For detection of the leakage current in the standby mode, current measurement must be performed in all states of the signals input to the row decoder 2x, the decoder 5, and the like, leading to an increase in detection of the leakage current. In the second and third examples in which all the word lines are set at active level with the control signal CNT, logic gates must be formed to correspond to all the output signals from the row decoder 2y or 2 or all the word lines. Accordingly, the circuit scale increases. A circuit for generating the control signal CNT is necessary, increasing the circuit scale. Also, a leakage current of the row decoder, the decoder, or the like itself cannot be detected.

SUMMARY OF THE INVENTION

The present invention has been made in view of the above situation of the prior art, and has as its object to provide a semiconductor integrated circuit in which the scale of a circuit used for detecting the leakage current in the standby mode is decreased, the detection time of the leakage current is shortened, and a leakage current of the decoder itself can be detected.

In order to achieve the above object, according to the primary aspect of the present invention, there is provided a semiconductor integrated circuit having a decoder for decoding a first signal supplied thereto and having a plurality of bits and outputting a second signal in which only a predetermined bit of the plurality of bits of the first signal is set at active level, and an internal circuit for, in an ordinary operation mode in which a standby signal is at first level, performing a predetermined processing operation in response to the second signal decoded by the decoder and, in a standby mode in which the standby signal is at second level, stopping the predetermined processing operation to be set in a low power consumption state, comprising a signal level fixing circuit for, when the standby signal is at second level, fixing the predetermined bit of the plurality of bits of the first signal at predetermined level, and supplying a resultant signal to the decoder. According to the second aspect of the present invention, the signal level fixing circuit in the primary aspect can be constituted as a circuit for fixing all the plurality of bits of the first signal at predetermined level.

According to the third aspect of the present invention, there is provided a semiconductor integrated circuit wherein the internal circuit in the primary aspect is a memory cell array which has a plurality of word lines and a plurality of bit lines, accesses an address corresponding to a selected word line and a selected bit line among the plurality of word lines and the plurality of bit lines in the ordinary operation mode, and stops access in the standby mode to set a memory content holding state, and the decoder is at least a row decoder of a row decoder for receiving the first signal as an address signal, decoding the first supplied bit of the first signal, setting one of the plurality of word lines at active level, and selecting the active-level word line, and a column decoder for decoding a supplied second bit of the first signal and selecting a predetermined bit line of the plurality of bit lines. According to the fourth aspect of the present invention, there is provided a circuit according wherein the internal circuit in the primary aspect is a circuit including a selector for selecting one of a plurality of third signals in accordance with a selection signal, and an internal processing unit for, in the ordinary operation mode, performing a predetermined processing operation in response to the third signal selected by the selector and, in the standby mode, stopping the predetermined processing operation to be set in a low power consumption state, and the decoder is a circuit for decoding the first signal supplied thereto and outputting the selection signal.

According to the fifth aspect of the present invention, there is provided a semiconductor integrated circuit, further comprising an output level control circuit for, in the standby mode in the primary aspect, setting a bit of the second signal, which is supplied from the decoder and set at active level, at inactive level, and supplying the inactive-level bit to the internal circuit.

According to the present invention having the aspects described above, the level of the signal input to the decoder is fixed by the standby signal in the standby mode. The states of the respective portions, including the decoder, and the signal levels of the respective states can be fixed to one or a small number of states regardless of the timing of transition to the standby mode. The number of times of measuring the current in leakage current detection is decreased to shorten the time required for detection of the leakage current. The leakage current of the decoder itself can also be detected. The scale of the circuit including a circuit for fixing the signal level, a circuit for generating a signal used for signal level fixing control, and the like can be reduced.

The above and many other objects, features and advantages of the present invention will become manifest to those skilled in the art upon making reference to the following detailed description and accompanying drawings in which preferred embodiments incorporating the principles of the present invention are shown by way of illustrative example.

DETAILED DESCRIPTION OF THE PREFERRED EMBODIMENTS

Several preferred embodiments of the present invention will be described with reference to the accompanying drawings.

Figure 7:
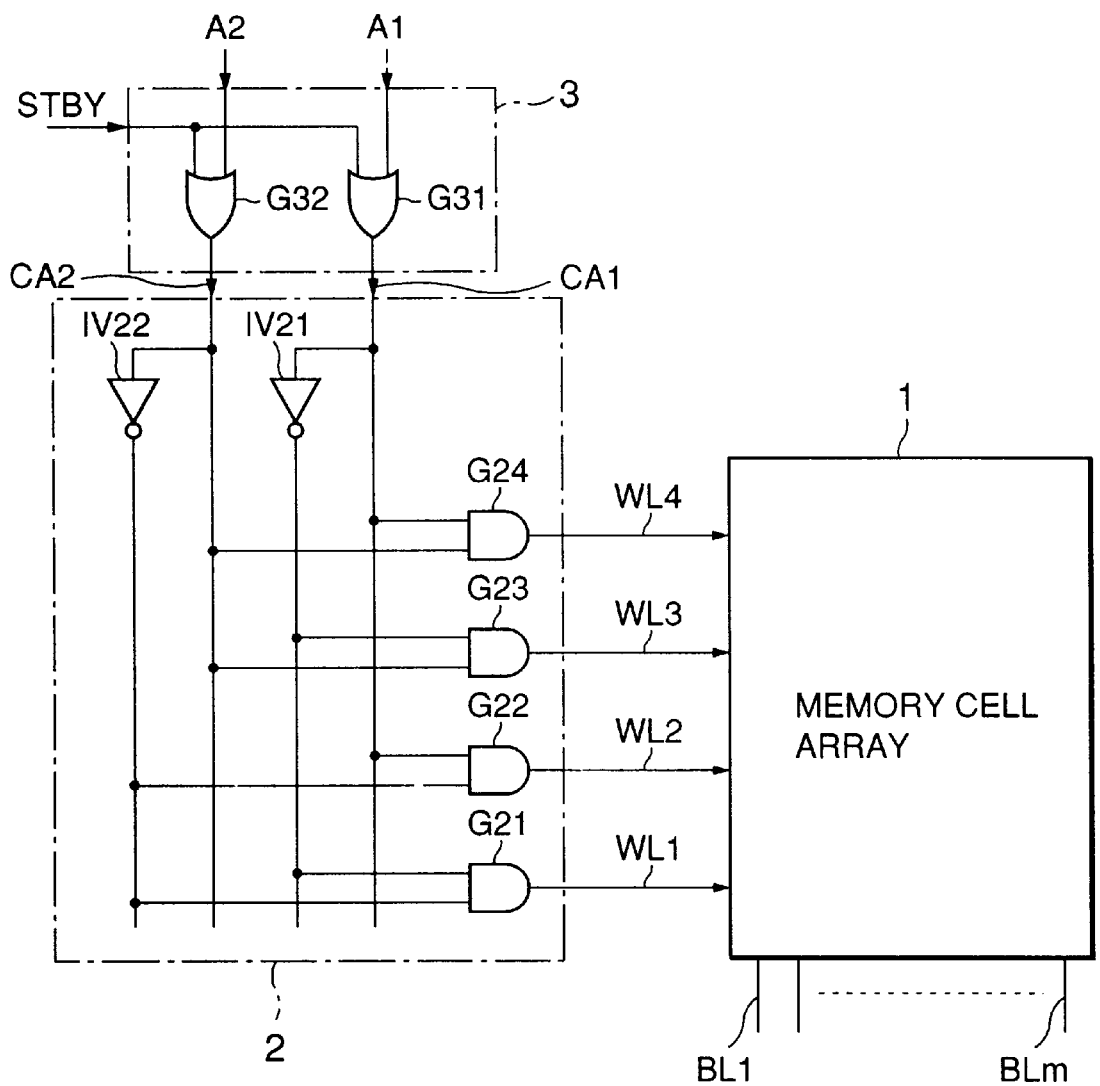
FIG. 7 is a circuit diagram showing the first embodiment of the present invention.

FIG. 7 is a circuit diagram showing the first embodiment of the present invention.

Figure 1:
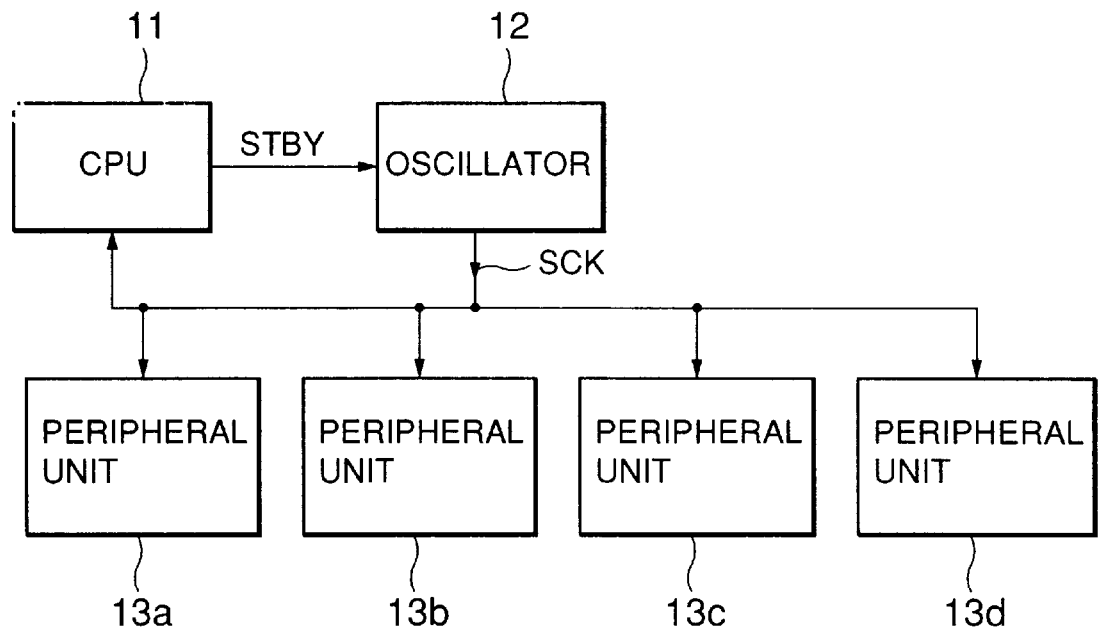
FIG. 1 is a block diagram for explaining the standby mode of a conventional semiconductor integrated circuit.
Figure 2:
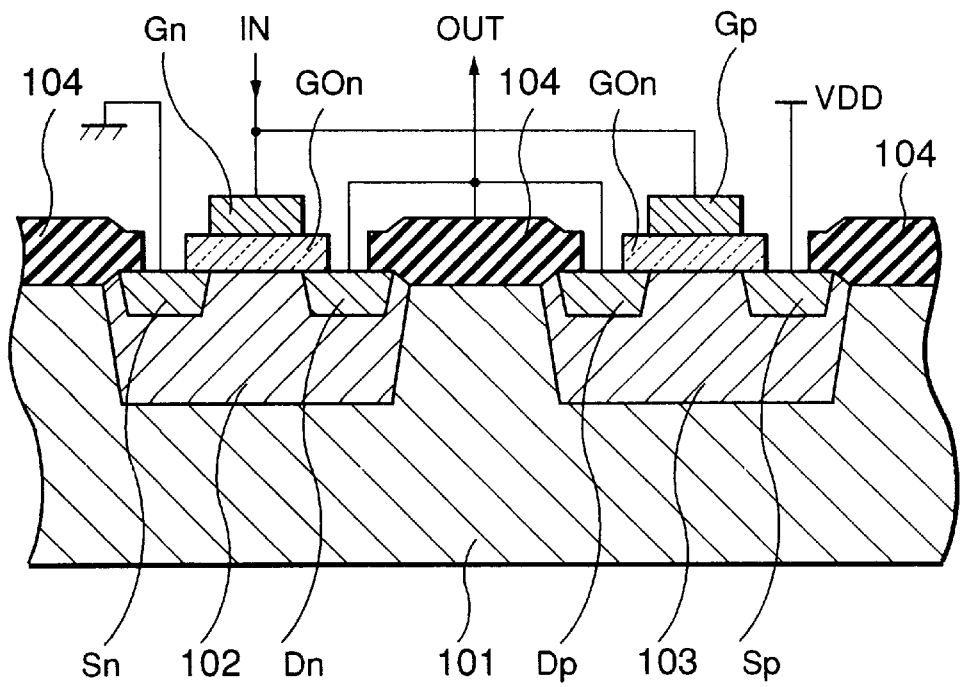
FIG. 2 is a sectional view of an inverter circuit portion for explaining the factor that causes the leakage current in the conventional semiconductor integrated circuit.
Figure 3:
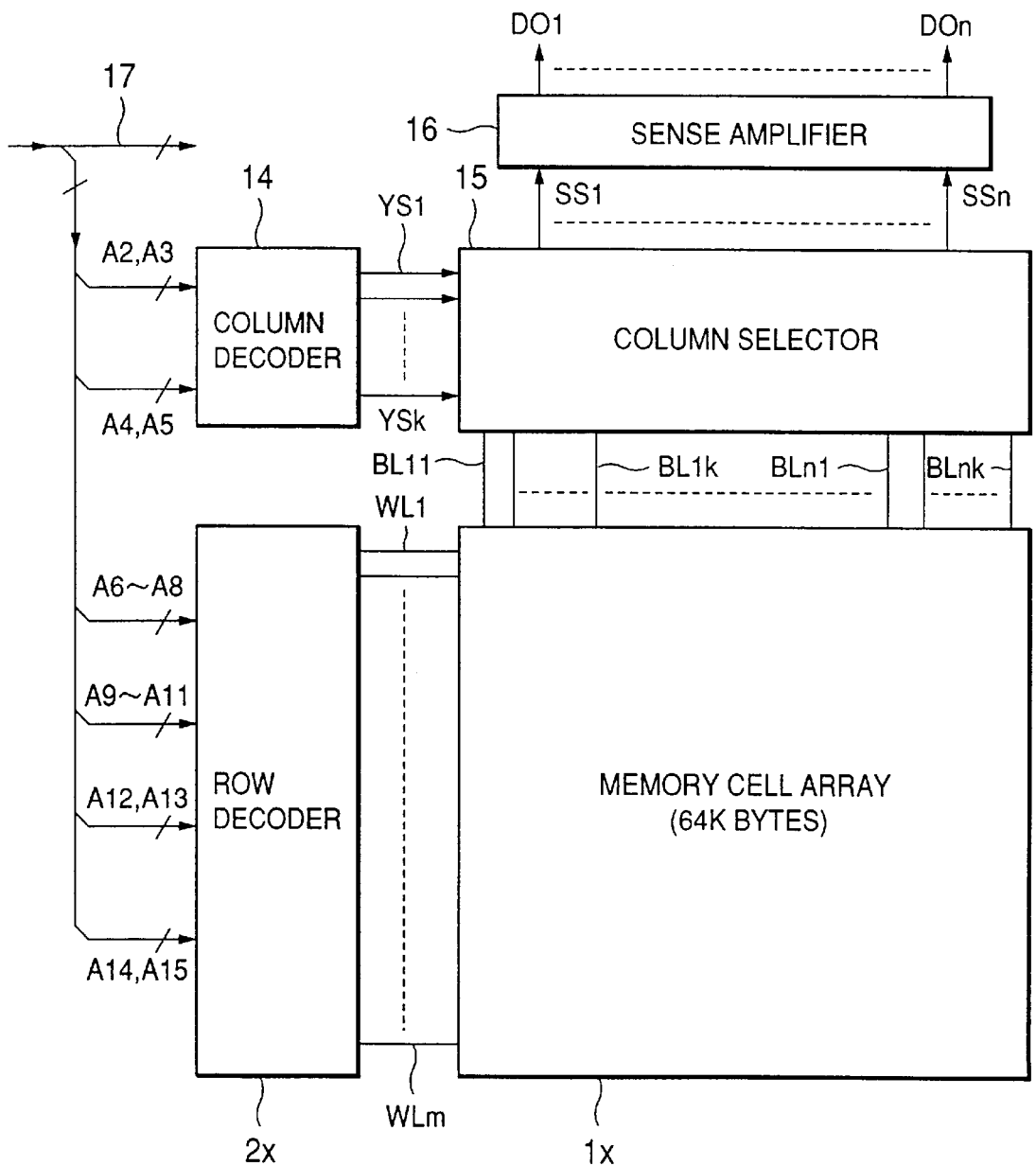
FIG. 3 is a circuit diagram showing the first example of the conventional semiconductor integrated circuit.
Figure 4:
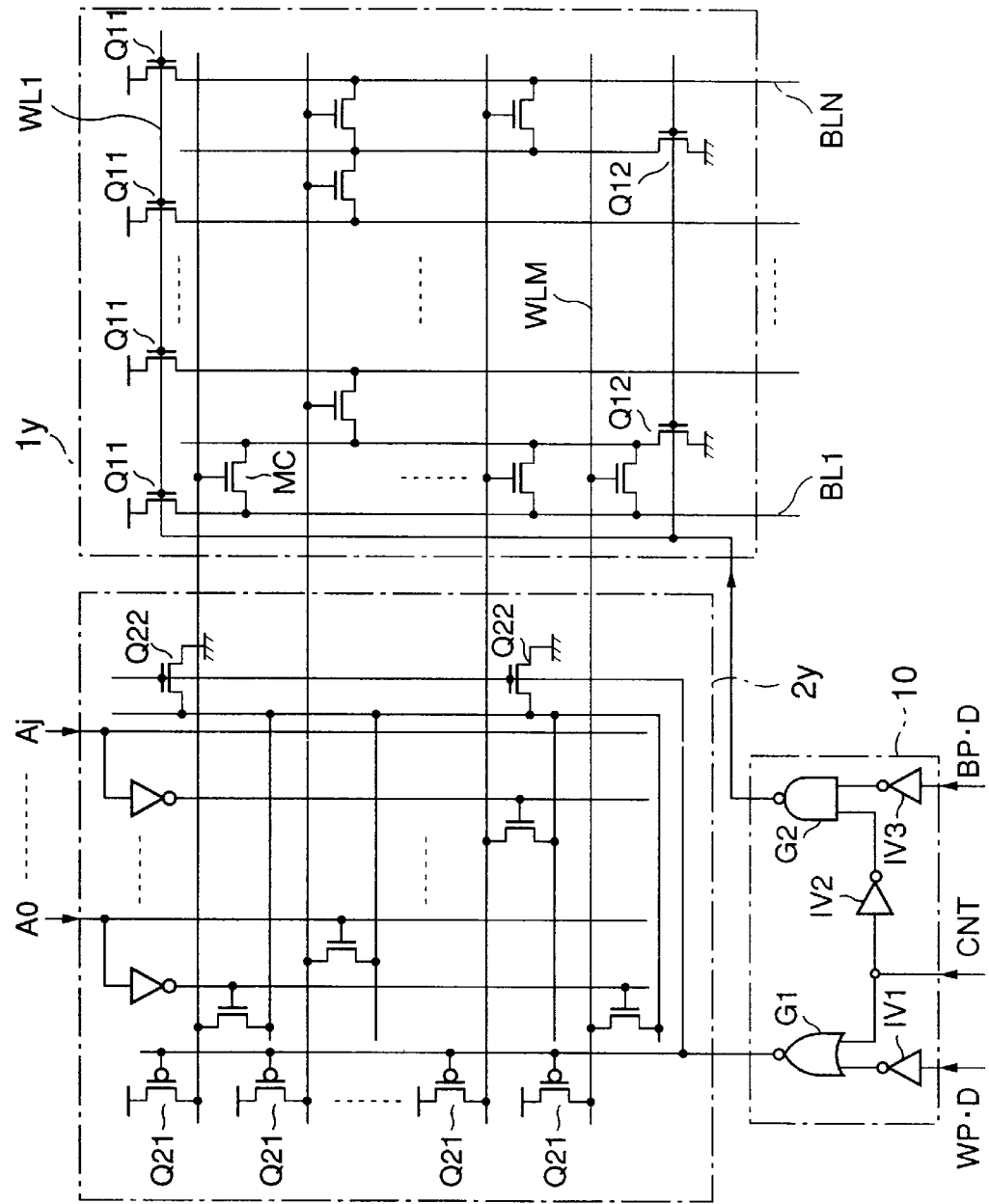
FIG. 4 is a circuit diagram showing the second example of the conventional semiconductor integrated circuit.
Figure 5:
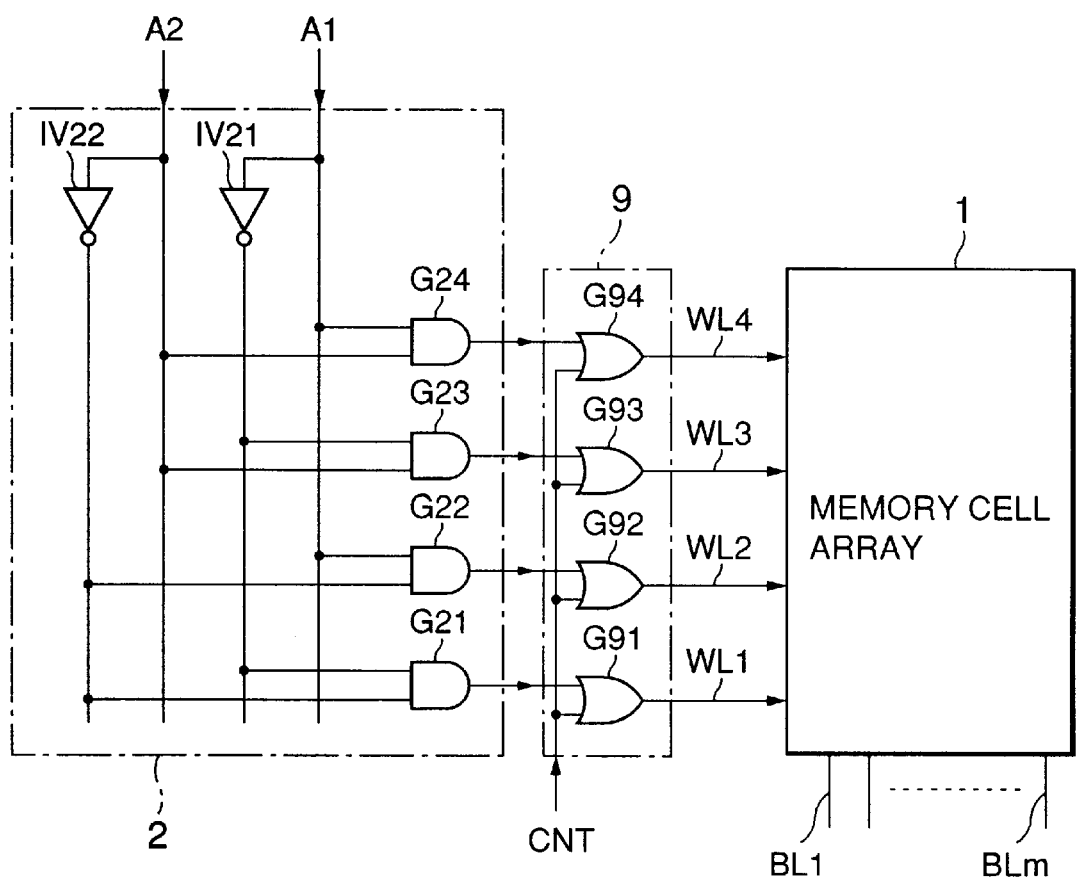
FIG. 5 is a circuit diagram showing the third example of the conventional semiconductor integrated circuit.

The first embodiment is different from the third example of the conventional semiconductor integrated circuit shown in FIG. 5 (to be referred to as the third conventional example hereinafter; the remaining examples will be referred to in the same manner) in the following respects. In the first embodiment, the decoder output control circuit 9 of the third conventional example is eliminated, and output signals from a row decoder 2 are supplied to corresponding ones of word lines WL1 to WL4 directly. In the third conventional example, the address data A1 and A2 are directly supplied to the row decoder 2. In the present invention, an input signal level fixing circuit 3 is provided which ORs each of address data A1 and A2, and a standby signal STBY with an OR gate G31 or G32, and supplies the obtained logical OR to the row decoder 2.

The operation of the first embodiment will be described.

In the ordinary operation mode in which the standby signal STBY is at low level, the input signal level fixing circuit 3 directly supplies the address data A1 and A2 to the row decoder 2. One of the word lines WL1 to WL4 is set at selection level (active level) in accordance with the address data A1 and A2. As a result, an address of a memory cell array 1 which corresponds to the word line of the selection level and the selected bit line is accessed.

In the standby mode in which the standby signal STBY is set at high level, both address data CA1 and CA2 supplied to the row decoder 2 are fixed at high level. Only the word line WL4 is always set at high level, i.e., active level (selection level) while the remaining word lines WL1 to WL3 are fixed at low level, i.e. inactive level (nonselection level). Namely, the signal (CA1, CA2) input to the row decoder 2 is always fixed in one state regardless of the timing of transition to the standby mode. The internal state of the row decoder 2, the level of the output signal of the row decoder 2, and the internal state of the memory cell array 1 are fixed in one state. A leakage current can be detected by only measuring the current obtained when this one state is fixed, thereby shortening the time required for detection of the leakage current. To detect the leakage current, the current of a non-defective semiconductor integrated circuit having no leakage current may be measured in advance, and this current may be compared with the current of a semiconductor integrated circuit as the target of the leakage current detection.

Figure 8:
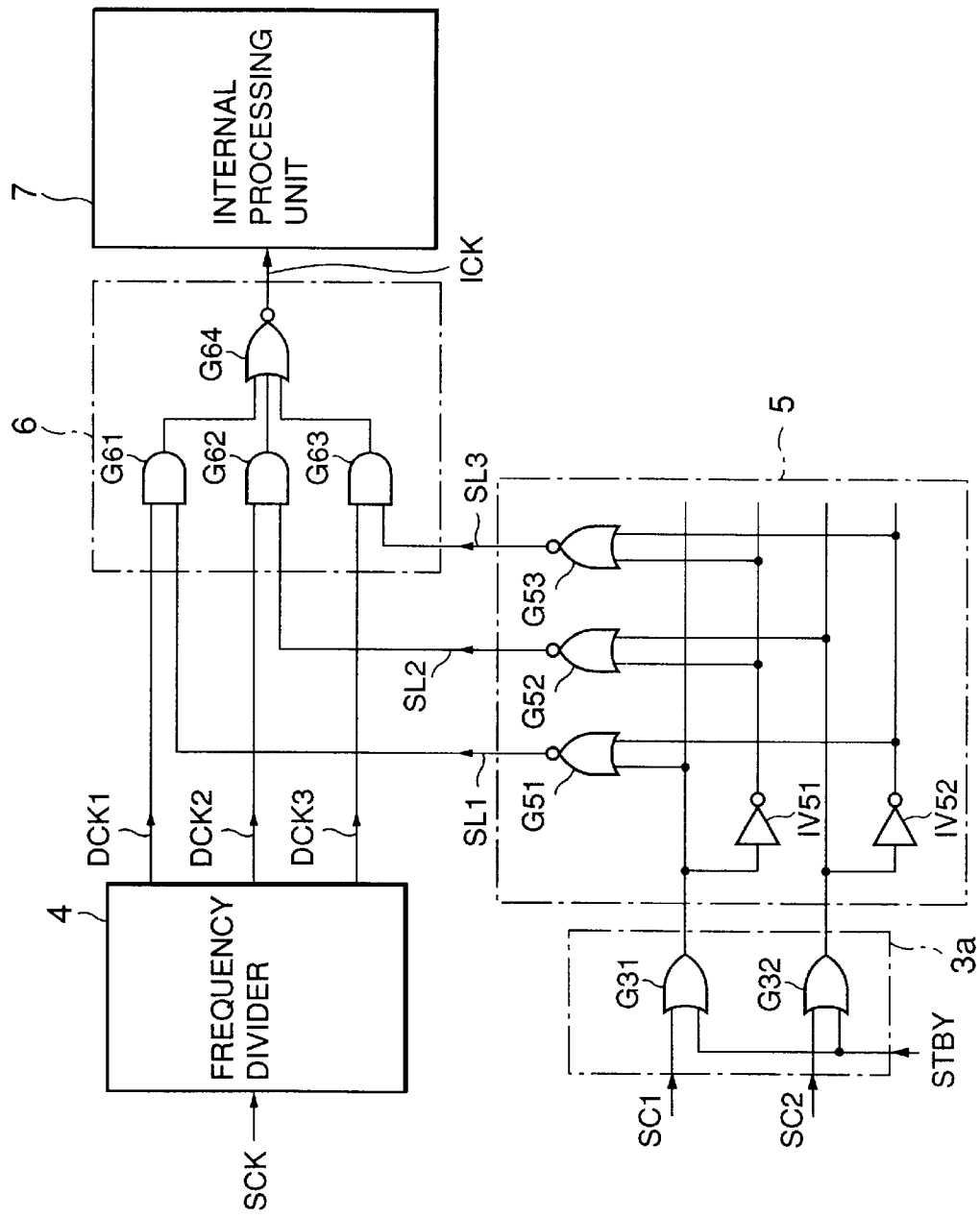
FIG. 8 is a circuit diagram showing the second embodiment of the present invention.

FIG. 8 is a circuit diagram showing the second embodiment of the present invention.

Figure 6:
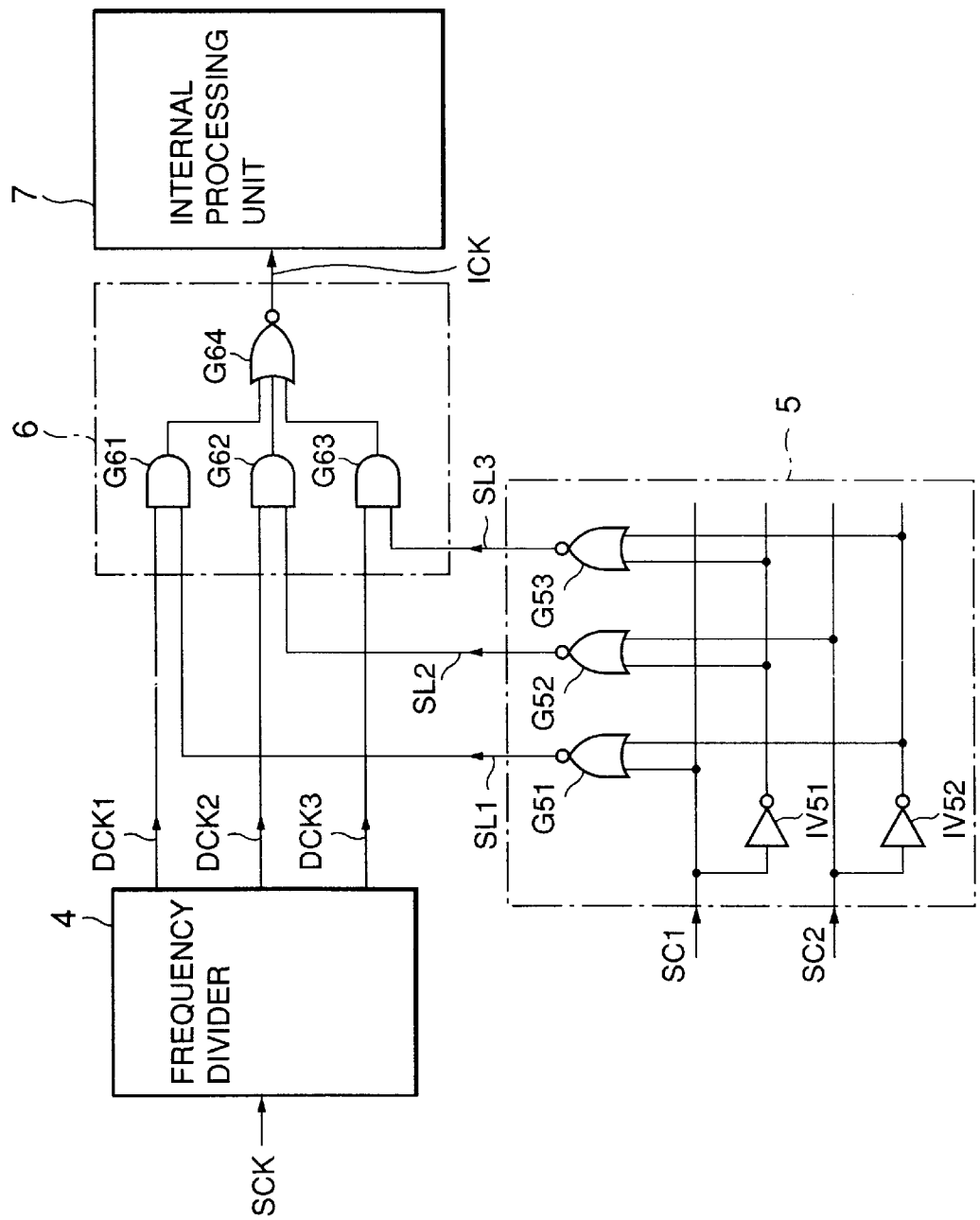
FIG. 6 is a circuit diagram showing the fourth example of the conventional semiconductor integrated circuit.

The second embodiment is obtained by applying the present invention to the fourth conventional example shown in FIG. 6.

In the fourth conventional example, the clock selection control signals SC1 and SC2 are directly supplied to the decoder 5. In the second embodiment, an input signal level fixing circuit 3a having OR gates G31 and G32 ORs each of clock selection control signals SC1 and SC2, and a standby signal STBY, and supplies the obtained logical OR to a decoder 5. Accordingly, the level of the signal supplied to the decoder 5 is fixed regardless of the timing of transition to the standby mode. The internal state of the decoder 5, the outputs (SL1 to SL3) of the decoder 5, the internal state of a selector 6, and the internal state of an internal processing unit 7 are fixed in one state. A leakage current can be detected by only measuring the current obtained when this one state is fixed, thereby shortening time required for detection of the leakage current.

Figure 9:
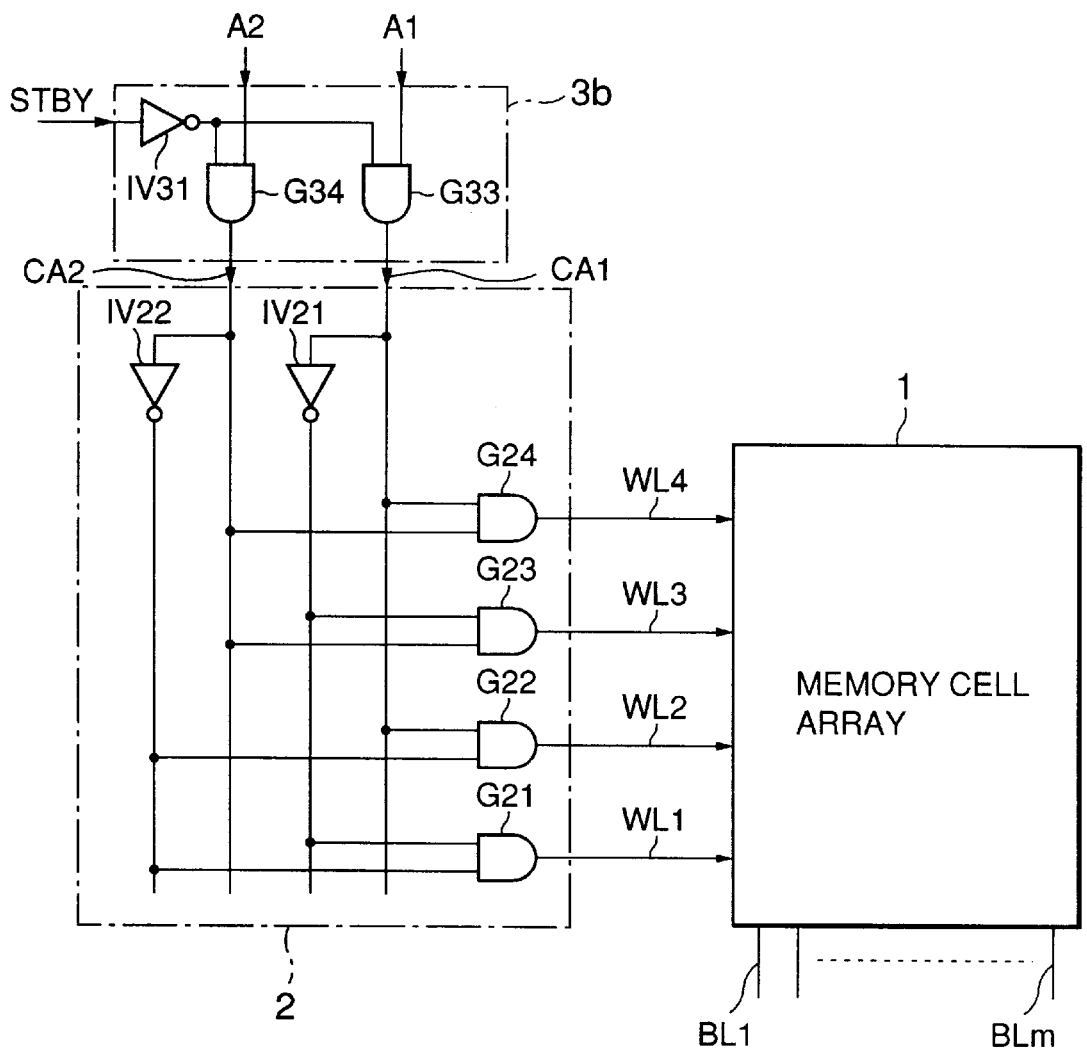
FIG. 9 is a circuit diagram showing the third embodiment of the present invention.

FIG. 9 is a circuit diagram showing the third embodiment of the present invention.

In the third embodiment, the OR gates G31 and G32 of the input signal level fixing circuit 3 of the first embodiment are replaced with AND gates G33 and G34, and an inverter IV31 for inverting the level of a standby signal STBY is formed, thus constituting an input signal level fixing circuit 3b. The input signal level fixing circuit 3b ANDs each of address data A1 and A2, and the level-inverted signal of the standby signal STBY, and supplies the obtained logical product to a row decoder 2.

In the third embodiment, in the standby mode (when the standby signal STBY is at high level), both signals (CA1, CA2) supplied to the row decoder 2 are fixed at low level, and only a word line WL1 is always fixed at high level while remaining word lines WL2 to WL4 are fixed at low level. Except for this, the operation, function, and effect of the third embodiment are basically the same as those of the first embodiment, and a further explanation of the third embodiment will accordingly be omitted.

Figure 10:
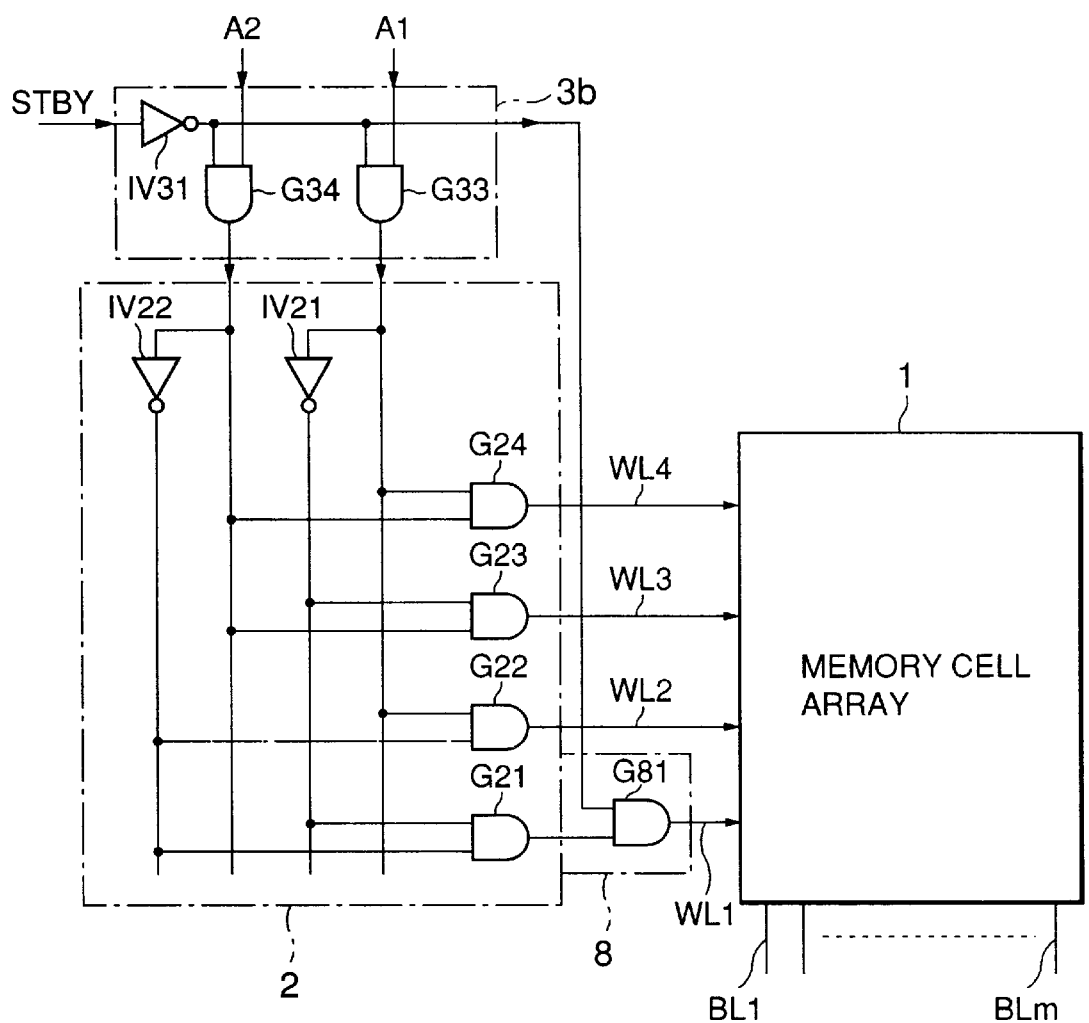
FIG. 10 is a circuit diagram showing the fourth embodiment of the present invention.

FIG. 10 is a circuit diagram showing the fourth embodiment of the present invention.

The fourth embodiment is obtained by adding, to the third embodiment, an output signal level control circuit 8 for also setting the level of the word line WL1, that alone goes high in the standby mode in the third embodiment, and supplying it to a memory cell array 1. In other words, in the standby mode, all word lines WL1 to WL4 are fixed at low level. Other basic operation, function, and effect are the same as those of the third embodiment.

Figure 11:
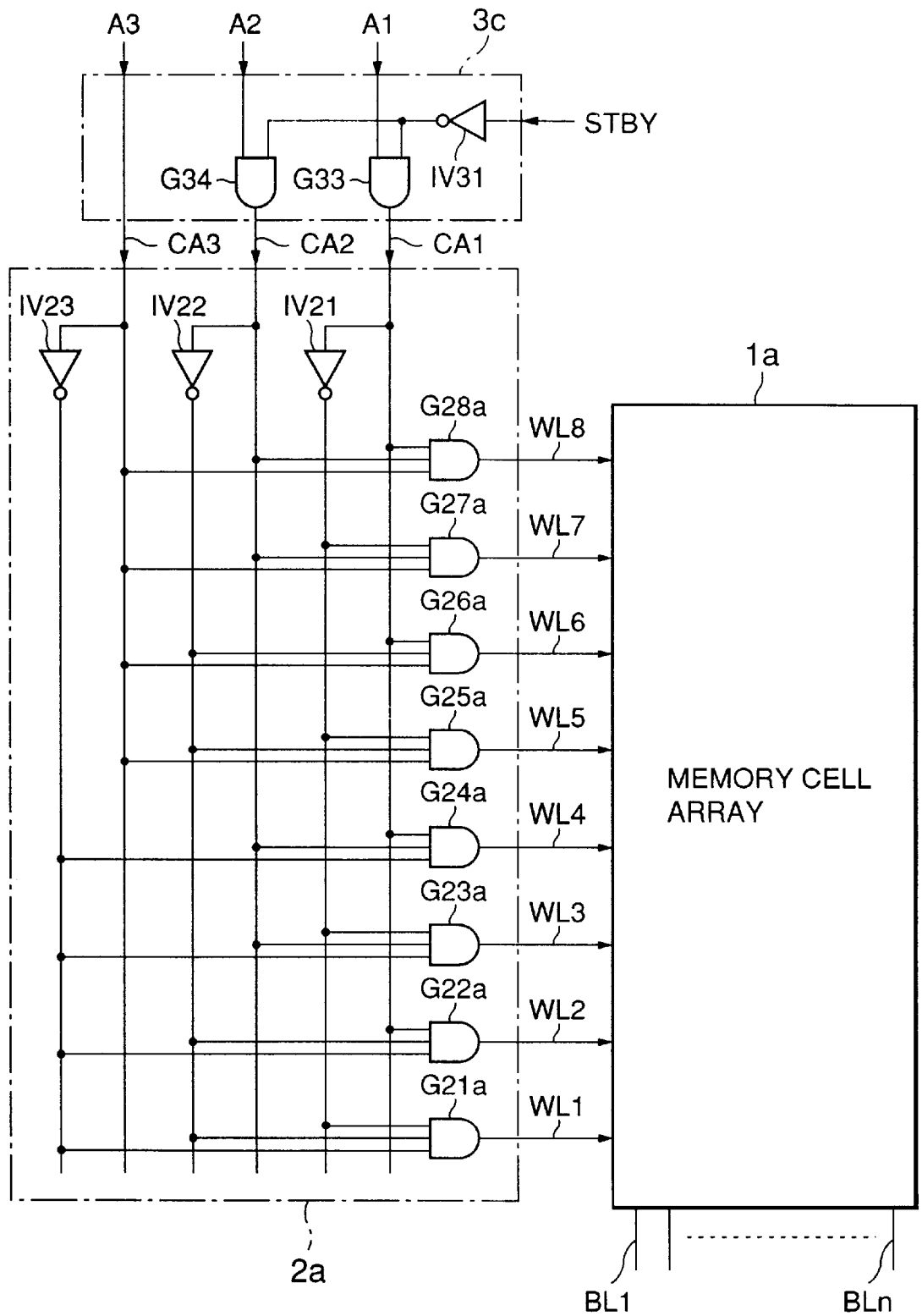
FIG. 11 is a circuit diagram showing the fifth embodiment of the present invention.

FIG. 11 is a circuit diagram showing the fifth embodiment of the present invention.

In the fifth embodiment, the 2-bit address data of the third embodiment is changed to have 3 bits A1, A2, and A3, and in place of the input signal level fixing circuit 3b of the third embodiment, an input signal level fixing circuit 3c is formed. The input signal level fixing circuit 3c fixes, of address data CA1 to CA3 supplied to a row decoder 2a in the standby mode, only the address data CA1 and CA2 at low level, and supplies the address data A3, which is unchanged, as the address data CA3. As a matter of course, since the address data consists of three bits, the row decoder is changed to a row decoder 2a and the memory cell array is changed to a memory cell array 1a.

In this embodiment, in the standby mode, word lines WL2 to WL4, and WL6 to WL8 are fixed at low level, and word lines WL1 and WL5 depend on the level of the address data A3. When the address data A3 is at high level, the word lines WL1 and WL5 are at low and high levels, respectively. When the address data A3 is at low level, the word lines WL1 and WL5 are at high and low levels, respectively. More specifically, there are two states that depend on the level of the address data A3. It suffices to measure the current obtained with each of these two states by changing the level of the address data A3. When compared to the conventional example in which the current is measured by sequentially setting all the word lines to high level one by one, the time required for detection of the leakage current can be greatly shortened. In the fifth embodiment, when compared to a case wherein all the address data are fixed in the standby mode, the number of logic gates can be reduced by a number corresponding to the number of bits in address data that are fixed.

In these embodiments, the levels of the signals (CA1 to CA3, and the like) supplied to the row decoder 2, 2a, or decoder 5 are fixed by the standby signal STBY. When compared to the second and third conventional examples in which the level of the output signal of the row decoder, i.e., the level of the word line, is fixed by the control signal CNT, the scale of the circuit used for fixing the signal level can be decreased. More specifically, regarding the scale of the circuit, in the present invention, assuming that the address data is N-bit data (N is an integer equal to or larger than 2) and that the levels of all the bits are to be fixed, N logic gates suffice, whereas $2^N$ logic gates are required in the conventional examples. Accordingly, the larger the number of bits (N), the larger the effect of the present invention.

In the conventional examples, the levels of the signals are fixed by the control signal CNT, and a circuit for generating the control signal CNT is required. In the present invention, since an existing standby signal STBY is used, the circuit scale can be reduced accordingly.

What we claim is:

1. A semiconductor integrated circuit having a decoder for decoding a first signal supplied thereto and having a plurality of bits and outputting a second signal in which only a predetermined bit of the plurality of bits of the first signal is set at an active level, and an internal circuit for, in an ordinary operation mode in which a standby signal is at a first level, performing a predetermined processing operation in response to the second signal decoded by said decoder and, in a standby mode in which the standby signal is at a second level, stopping the predetermined processing operation to be set in a low power consumption state, comprising a signal level fixing circuit for, when the standby signal is at the second level, fixing the predetermined bit of the plurality of bits of the first signal at predetermined level, and supplying a resultant signal to said decoder.

2. A circuit according to claim 1, wherein said signal level fixing circuit is a circuit for fixing all of the plurality of bits of the first signal at a predetermined level.

3. A circuit according to claim 1, wherein said internal circuit is a memory cell array which has a plurality of word lines and a plurality of bit lines, accesses an address corresponding to a selected word line and a selected bit line among said plurality of word lines and said plurality of bit lines in the ordinary operation mode, and stops access in the standby mode to set a memory content holding state, and said decoder is at least a row decoder of a row decoder for receiving the first signal as an address signal, decoding the first supplied bit of the first signal, setting one of said plurality of word lines at active level, and selecting said active-level word line, and a column decoder for decoding a supplied second bit of the first signal and selecting a predetermined bit line of said plurality of bit lines.

4. A circuit according to claim 1, wherein said internal circuit is a circuit including a selector for selecting one of a plurality of third signals in accordance with a selection signal, and an internal processing unit for, in the ordinary operation mode, performing a predetermined processing operation in response to the third signal selected by said selector and, in the standby mode, stopping the predetermined processing operation to be set in a low power consumption state, and said decoder is a circuit for decoding the first signal supplied thereto and outputting the selection signal.

5. A circuit according to claim 1, further comprising an output level control circuit for in the standby mode, setting a bit of the second signal, which is supplied from said decoder and set at active level, at inactive level, and supplying the inactive-level bit to said internal circuit.

6. A semiconductor integrated circuit having a decoder for decoding a first signal supplied thereto and having a plurality of bits and outputting a second signal in which only a predetermined bit of the plurality of bits of the first signal is set at an active level, and an internal circuit for, in an ordinary operation mode in which a standby signal is at a first level, performing a predetermined processing operation in response to the second signal decoded by said decoder and, in a standby mode in which the standby signal is at a second level, stopping the predetermined processing operation to be set in a low power consumption state, comprising a signal level fixing circuit for, when the standby signal is at the second level, fixing the predetermined bit of the plurality of bits of the first signal at predetermined level, and supplying a resultant signal to said decoder, wherein said internal circuit is a circuit including a selector for selecting one of a plurality of third signals in accordance with a selection signal, and an internal processing unit for, in the ordinary operation mode, performing a predetermined processing operating in response to the third signal selected by said selector and, in the standby mode, stopping the predetermined processing operating to be set in a low power consumption state, and said decoder is a circuit for decoding the first signal supplied thereto and out putting the selection signal.

7. A semiconductor integrated circuit having a decoder for decoding a first signal supplied thereto and having a plurality of bits and outputting a second signal in which only a predetermined bit of the plurality of bits of the first signal is set at an active level, and an internal circuit for, in an ordinary operation mode in which a standby signal is at a first level, performing a predetermined processing operation in response to the second signal decoded by said decoder and, in a standby mode in which the standby signal is at a second level, stopping the predetermined processing operation to be set in a low power consumption state, comprising a signal level fixing circuit for, when the standby signal is at the second level, fixing the predetermined bit of the plurality of bits of the first signal at predetermined level, and supplying a resultant signal to said decoder, wherein during each standby mode said decoder sets the same wordline active.

8. The circuit of claim 7, wherein said signal level fixing circuit comprises an OR gate for each of the plurality of bits of the first signal, each said OR gate comprising a standby mode input wherein the output of each OR gate is set to an active level during the standby mode so that all inputs to said decoder are supplied with all active values during standby mode.

* * * * *